(12) United States Patent
Hwang et al.

(10) Patent No.: US 9,877,379 B2
(45) Date of Patent: Jan. 23, 2018

(54) BENDABLE ELECTRONIC DEVICE

(71) Applicants: Chang-soon Hwang, Incheon (KR); Sun-jong Kim, Seoul (KR)

(72) Inventors: Chang-soon Hwang, Incheon (KR); Sun-jong Kim, Seoul (KR)

( * ) Notice: Subject to any disclaimer, the term of this patent is extended or adjusted under 35 U.S.C. 154(b) by 7 days.

(21) Appl. No.: 14/894,361

(22) PCT Filed: May 28, 2014

(86) PCT No.: PCT/KR2014/004782
§ 371 (c)(1),
(2) Date: Jan. 22, 2016

(87) PCT Pub. No.: WO2014/193167
PCT Pub. Date: Dec. 4, 2014

(65) Prior Publication Data
US 2016/0135286 A1 May 12, 2016

(30) Foreign Application Priority Data

May 29, 2013 (KR) ........................ 10-2013-0061103

(51) Int. Cl.
*H05K 1/02* (2006.01)
*H05K 9/00* (2006.01)
(Continued)

(52) U.S. Cl.
CPC ........... *H05K 1/0212* (2013.01); *H05K 1/028* (2013.01); *H05K 1/189* (2013.01); *H05K 5/0017* (2013.01);
(Continued)

(58) Field of Classification Search
CPC ....... G02F 1/133305; H01L 2251/5338; H01L 51/0097; G06F 1/1626; G06F 1/1652;
(Continued)

(56) References Cited

U.S. PATENT DOCUMENTS 8,800,284 B2 * 8/2014 Takahashi ............... F03G 7/065
60/528
9,274,560 B2 * 3/2016 Ahn ...................... G06F 1/1652
(Continued)

FOREIGN PATENT DOCUMENTS

JP 60-195386 A 10/1985
JP 2004-092629 A 3/2004
(Continued)

OTHER PUBLICATIONS

Lens Cover Structure for Camera, Nov. 4, 2004, Espacenet JP2004309964 translate, Translation date Jan. 9, 2017.*

*Primary Examiner* — James Wu
*Assistant Examiner* — Michael Matey
(74) *Attorney, Agent, or Firm* — Patent Office of Dr. Chung Park

(57) ABSTRACT

Disclosed is a flexible electronic device, including: a body made of a flexible material; a display unit; a flexible circuit board; a bending adjuster having a first plate that maintains a flat shape at room temperature, and a second plate that maintains a bent state at a specific temperature or more and having an elastic force larger than that of the first plate in a superelastic state, and is configured to adjust bending of the body by these plates, such that it is possible to improve reality of an image on a display unit by controlling the overall electronic device to be bent at a predetermined angle, more stably maintain a bent state and a flat state, reliably prevent a display unit and a flexible circuit board from being damaged, and stably maintain the bent state and the flat state despite using for a long period of time.

19 Claims, 12 Drawing Sheets

(51) Int. Cl.
*H05K 5/00* (2006.01)
*H05K 1/18* (2006.01)

(52) U.S. Cl.
CPC . *H05K 9/0054* (2013.01); *H05K 2201/10128* (2013.01)

(58) Field of Classification Search
CPC ...... G06F 1/1637; G06F 1/16; H04M 1/0268; G09F 9/301; H05K 1/0212; H05K 1/028; H05K 1/189; H05K 2201/10128
See application file for complete search history.

(56) References Cited

U.S. PATENT DOCUMENTS

| | | | | |
|---|---|---|---|---|
| 2011/0095975 A1* | 4/2011 | Hwang | ................ | G06F 1/1626 345/156 |
| 2013/0127690 A1* | 5/2013 | Tsai | ................ | G09F 9/301 345/55 |
| 2013/0207793 A1* | 8/2013 | Weaber | ................ | G06F 1/1601 340/407.2 |
| 2013/0286462 A1* | 10/2013 | Yeo | ................ | G09G 5/00 359/291 |
| 2014/0004906 A1* | 1/2014 | Chi | ................ | H04B 1/38 455/566 |
| 2014/0045283 A1* | 2/2014 | Hirakata | ................ | H01L 51/56 438/22 |
| 2014/0111549 A1* | 4/2014 | Vanska | ................ | G06F 1/1626 345/656 |

FOREIGN PATENT DOCUMENTS

| | | |
|---|---|---|
| JP | 2004-309964 A | 11/2004 |
| KR | 10-2011-0048640 A | 5/2011 |

\* cited by examiner

400a

BENDABLE ELECTRONIC DEVICE

CROSS-REFERENCE TO PRIOR APPLICATIONS

This application is a national Stage Patent Application of PCT International Patent Application No. PCT/KR2014/004782, filed on May 28, 2014 under 35 U.S.C. §371, which claims priority of Korean Patent Application No. 10-2013-0061103, filed on May 29, 2013, which are all hereby incorporated by reference in their entirety.

TECHNICAL FIELD

The present invention relates to a flexible electronic device, and more specifically, to a flexible electronic device capable of bending with a simple structure, and reliably preventing an internal circuit and a display unit from being damaged due to heat and pressure occurring during a process of controlling flexibility.

BACKGROUND ART

Most electronic devices include a display unit to display images, characters, or the like. As a representative example, there is a mobile terminal which may be portable and may have at least one of a function of performing voice and video communications, a function of inputting and outputting information, a function of transmitting and receiving data, a function of storing data, and the like.

As the functions of the mobile terminal are various, the mobile terminal has complex functions of photographing pictures or moving pictures, playing music or moving image files, executing game, receiving broadcasting, executing wireless Internet, and the like, and has been implemented as a multimedia player form.

Further, for the mobile terminal implemented in the multimedia player form, in order to perform the complex functions, new and various attempts in hardware or software have been conducted. For example, the mobile terminal is provided with a user interface environment, etc., to allow a user to easily and conveniently search for or select the functions.

However, since the electronic device provided with the display unit is maintained in a flat state, in the case of a large TV, viewing angles of a central portion and both end portions are different from each other, such that reality of an image displayed on the display unit may be deteriorated.

In order to solve the above-described problem, an electronic device having a technique described in Korean Patent Laid-Open Publication No. 10-2011-0048640 as illustrated in FIGS. 1 and 2 has been developed. Characteristics of the technique are that the electronic device includes a body 2 partially made of a flexible material, a display unit 1 included in the body 2 to display an image, and an actuator 8 included in the body 2 to selectively provide an electrical signal for changing its own shape so as to change the shape of the body, in which the actuator 8 is made of a shape memory alloy of which the original shape and the changed shape are alternately changed depending on a change in a temperature.

By this configuration, the technique disclosed in Korean Patent Laid-Open Publication No. 10-2011-0048640 has an advantage in that the actuator 8 made of the shape memory alloy is included in the body 2 to control the electronic device to be flexible, thereby displaying the image more realistically. However, the actuator 8 is made of the shape memory alloy of one material, such that the screen may be stably maintained in a bent state but may not be stably maintained in a flat state.

Further, in order to control the shape memory alloy forming the actuator 8, the actuator is heated. In this case, circuit boards or the display unit included in the electronic device may be damaged due to heat and electromagnetic waves generated upon the heating.

DISCLOSURE

Technical Problem

Accordingly, an object of the present invention is to provide a flexible electronic device capable of more improving reality of an image output from a display unit by controlling the overall electronic device to be bent at a predetermined angle.

Another object of the present invention is to provide a flexible electronic device capable of more stably maintaining a bent state and a flat state.

In addition, another object of the present invention is to provide a flexible electronic device capable of reliably preventing a display unit and a flexible circuit board from being damaged.

Further, another object of the present invention is to provide a flexible electronic device capable of stably maintaining a bent state and a flat state despite using for a long period of time.

Furthermore, another object of the present invention is to provide a flexible electronic device capable of minimizing power consumption by maintaining a bent state due to a temporary supply of power.

Furthermore, another object of the present invention is to provide a flexible electronic device capable of being quickly changed from a bent state into a flat state.

Technical Solution

In order to achieve the above-described objects, according to an aspect of the present invention, there is provided a flexible electronic device, including: a body made of a flexible material; a display unit included in the body; a flexible circuit board included in the body; a bending adjuster which includes a first plate configured to maintain a flat shape at room temperature, and a second plate configured to maintain a bent state at a specific temperature or more and having an elastic force larger than that of the first plate in a superelastic state, and is configured to adjust a bending of the body by these plates.

The first plate may include any one of a shape memory alloy, high-elastic metal, a polymer, and a polymer composite material, and the second plate may include the shape memory alloy.

The second plate may include a heating layer formed on one surface thereof, and a shielding layer formed on the other surface to shield heat and electromagnetic waves.

The first plate may include any one of a shape memory alloy maintaining a ring shape at the room temperature, high-elastic metal, a polymer, and a polymer composite material, and the second plate may be configured to maintain an arc shape at a specific temperature or more.

The bending adjuster may include a main plate made of flat or ring-shaped carbon fiber reinforced plastics, and an auxiliary plate provided in the main plate and made of a shape memory alloy maintaining a state deformed from the flat or ring shape at a specific temperature or more.

The main plate may be configured to generate heat by a supply of elasticity to heat the auxiliary plate, and the main plate may include a shielding layer formed on one surface thereof to shield heat and electromagnetic waves.

The bending adjuster may include a shape memory spring or a shape memory loop configuration maintain a flexible state at room temperature and maintain a memorized shape at a specific temperature or more, and wires of which one end is connected to both ends of the shape memory spring and the other end is connected to both side surfaces in the body, respectively.

The flexible electronic device may further include: a fixture coupled with the body to fix the body in a bent state when the body is bent.

The fixture may include an internal cover, and an external cover coupled with the internal cover.

The flexible electronic device may further include: a third plate made of a shape memory alloy and formed on one surface of the internal cover or the external cover to release a coupling of the internal cover with the external cover.

The electronic device may receive on/off of bending by the bending adjuster and time when the bent state is maintained from a user by a user interface and controls a supply of power to the second plate based on information input from the user.

According to another aspect of the present invention, there is provided an electronic device, including: a body made of a flexible material; a display unit included in the body; a flexible circuit board included in the body; a bending adjuster which may include a shape memory spring or a shape memory loop configured to maintain a flexible state at room temperature and maintain a memorized shape at a specific temperature or more, and wires of which one end is connected to both ends of the shape memory spring and the other end is connected to both side surfaces in the body, respectively, wherein the shape memory spring or the shape memory loop may include a heating layer formed on a surface thereof to adjust the bending of the body.

The shape memory spring or the shape memory loop may further include an installation box at an outside thereof, in which the shape memory spring or the shape memory loop is installed.

The installation box may include a shielding layer formed on an entire surface or one surface thereof to shield heat and electromagnetic waves.

The bending adjuster further may include a cover box in which the installation box is installed, and both ends of the wire are connected to both side surfaces of the installation box.

A front surface and a back surface of the cover box have different thicknesses from each other, and a central portion of a portion having a thin thickness is concavely bent.

According to another aspect of the present invention, there is provided an electronic device, including: a flexible body; and a bending adjuster which includes a first plate configured to maintain a flat shape at room temperature, and a second plate configured to maintain a bent state at a specific temperature or more and having an elastic force larger than that of the first plate in a superelastic state, and is configured to adjust a bending of the body by these plates.

The first plate may include any one of a shape memory alloy, high-elastic metal, a polymer, and a polymer composite material, and the second plate may include the shape memory alloy.

The bending adjuster may include a main plate made of flat or ring-shaped carbon fiber reinforced plastics, and an auxiliary plate provided in the main plate and made of a shape memory alloy maintaining a state deformed from the flat or ring shape at a specific temperature or more.

Advantageous Effects

In accordance with the flexible electronic device according to the present invention, it is possible to more improve the reality of the image output from the display unit by controlling the overall electronic device to be bent at a predetermined angle.

In addition, in accordance with the flexible electronic device according to the present invention, it is possible to more stably maintain the bent state and the flat state.

Further, in accordance with the flexible electronic device according to the present invention, it is possible to reliably prevent the display unit and the flexible circuit board from being damaged.

Furthermore, in accordance with the flexible electronic device according to the present invention, it is possible to stably maintain the bent state and the flat state despite using for a long period of time.

Furthermore, in accordance with the flexible electronic device according to the present invention, it is possible to minimize the power consumption by maintaining the bent state due to the temporary supply of power.

Furthermore, in accordance with the flexible electronic device according to the present invention, it is possible to be quickly changed from the bent state into the flat state

BEST MODE

Hereinafter, a flexible electronic device according to embodiments of the present invention will be described in detail with reference to the accompanying drawings.

Figure 3:
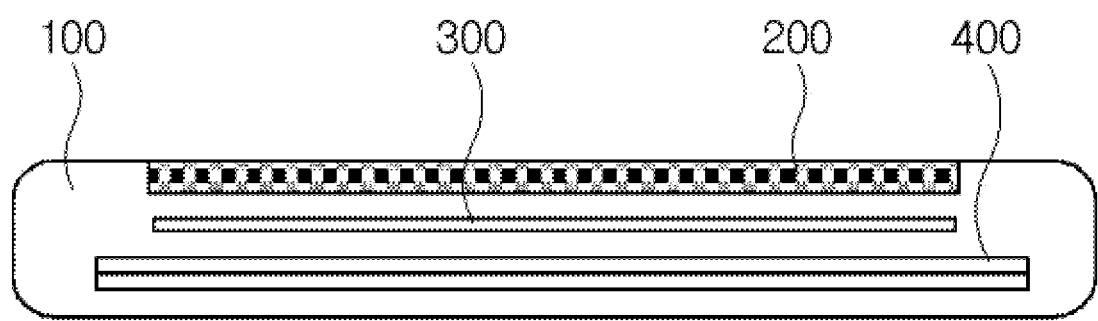
FIG. 3 is a view describing a concept of a flexible electronic device according to an embodiment of present invention.

The present invention relates to a flexible electronic device capable of maintaining a flat plate type electronic device provided with a display unit, such as a TV, a smart phone, a PDA, and a tablet PC, in a state bent at a specific angle. As illustrated in FIG. 3, the flexible electronic device has a configuration which includes a body 100, a display unit 200 included in the body 100, a flexible circuit board 300 included in the body 100, and a bending adjuster 400 included in the body 100.

Herein, the body 100 may be made of a flexible material so as to be entirely or partly bent, and the display unit 200 is also formed of organic light emitting diodes (OLEDs) with good flexibility. The OLED is provided with a protective cover (not illustrated) with good flexibility on a surface thereof, such that it is possible to easily bent at a specific angle by the bending adjuster 400.

Figure 4A:
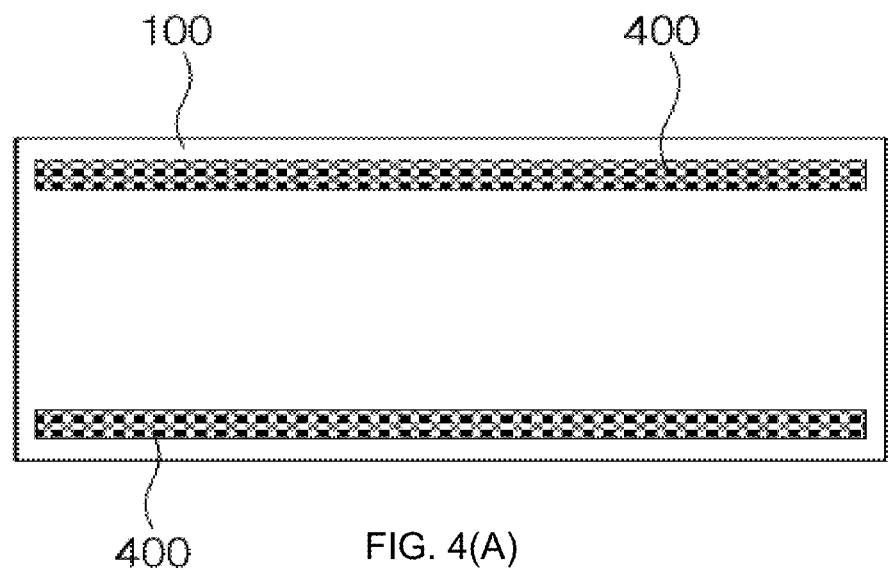
FIGS. 4(A) and 4(B) are views describing a concept an installation position of a bending adjuster of the flexible electronic device according to the embodiment of the present invention.
Figure 4B:
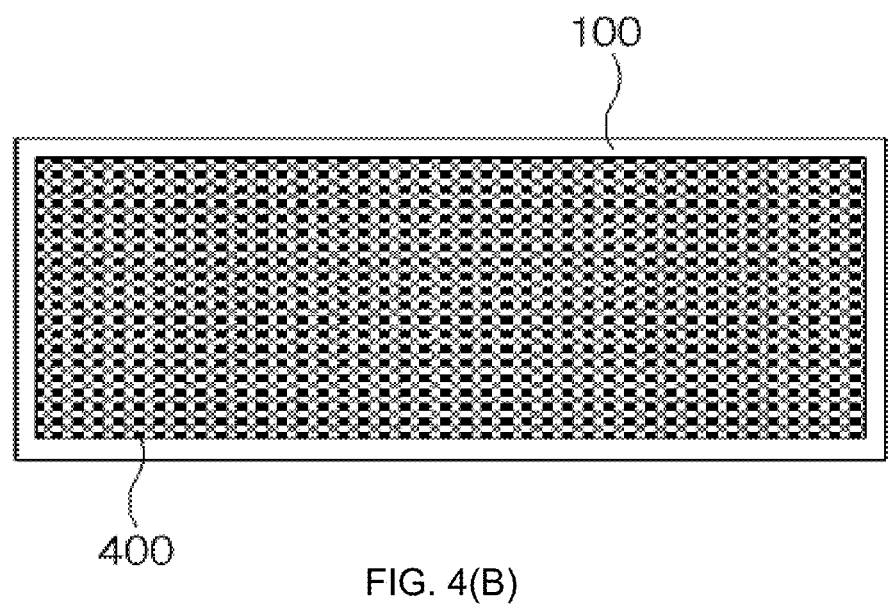

In this case, as illustrated FIG. 4(A), the bending adjuster 400 may be formed at both edges of the body 100 in a length direction thereof, and as illustrated in FIG. 4(B), the bending adjuster may also be formed to cover the overall the body 100. Alternately, although not illustrated in the drawings, the bending adjuster 400 may be formed in the body 100 or at a surface portion of the body 100, may also be installed at both sides of an inner surface of a body cover (not illustrated) detachably provided at a rear portion of the body 100, and may also be installed at an inner surface of a protective case (not illustrated) for protecting the body 100.

Of course, the body cover (not illustrated) and the protective case (not illustrated) may also be made of a flexible material so as to be entirely or partly bent.

Figure 5:
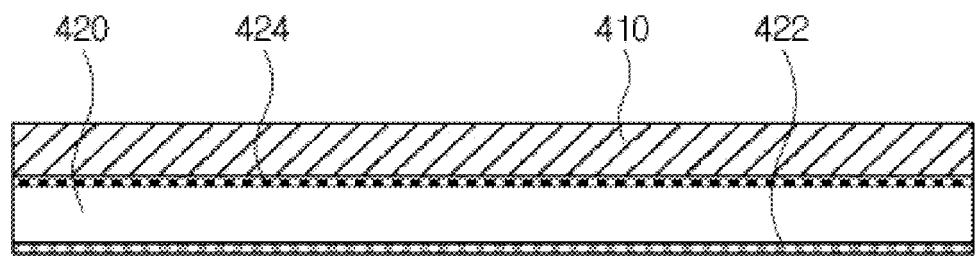
FIG. 5 is a view describing a concept of the bending adjuster of the flexible electronic device according to the embodiment of the present invention.

In addition, as illustrated in FIG. 5, the bending adjuster 400 includes a first plate 410 made of a shape memory alloy, high elastic metal, a polymer, or a polymer composite material, and a second plate 420 made of the shape memory alloy. Preferably, the first plate 410 and the second plate 420 are formed to memorize different shapes from each other.

Herein, the first plate 410 is made of the shape memory alloy, the high elastic metal, the polymer, or the polymer composite material so as to maintain the flat state at room temperature, and the second plate 420 is made of the shape memory alloy for memorizing the state bent at a specific temperature or more.

That is, the shape memory alloy described in the present invention uses nitinol containing titanium (Ti) and nickel (Ni) as major elements, and has superelasticity to return to a memorized shape at a specific temperature or more.

Of course, the shape memory alloy of the present invention is not limited to nitinol, but may use an alloy of Cu—Zn—Ni, Cu—Zn—Al, Cu—Al—Ni, Ag—Ni, Au—Cd, or the like, which is obtained by classifying metal contained as the major elements into nickel (Ni), copper (Cu), and iron (Fe), etc., and in detail, combining it with another metal such as zinc (Zn), aluminum (Al), gold (Au), and silver (Ag), etc.

Thereby, when the first plate 410 is made of a shape memory alloy, in order to reliably reveal superelasticity at room temperature, a temperature for generating the superelasticity may be appropriately controlled depending on the used environment. For example, when using the flexible electronic device during the summer in Korea, the temperature may be set to be 5 to 10° C.

Further, it is necessary for the second plate 420 to maintain a flexible state at room temperature, and then reveal the superelasticity at a specific temperature or more. Therefore, when the temperature for generating the superelasticity is set to be about 50° C., the flexible electronic device may be stably used even during the hot summer in Korea. As a result, the temperature in which the superelasticity is revealed may be appropriately controlled depending on the used environment.

In this case, the second plate 420 forming the bending adjuster 400 applies elasticity larger than that of the first plate 410 when the superelasticity is revealed, thereby allowing the electronic device of the present invention to maintain a state bent in a shape memorized by the second plate 420.

Figure 6:
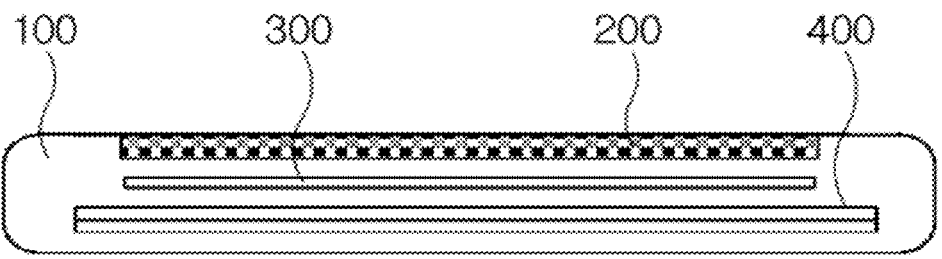
FIG. 6 is views illustrating a state in which the flexible electronic device according to the embodiment of the present invention is bent.
Figure 6:
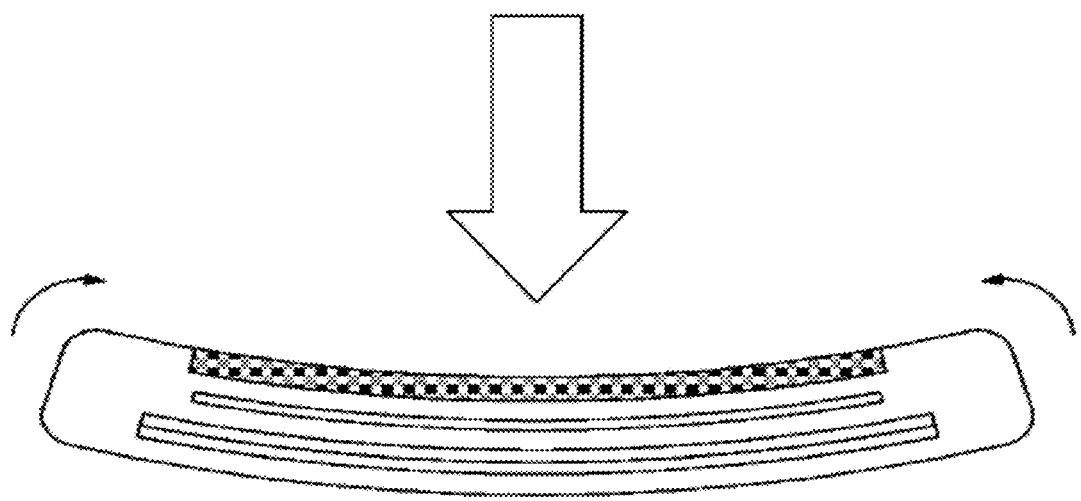

That is, as illustrated in FIG. 6, since the first plate 410 is in the superelastic state and the second plate 420 is in the flexible state at room temperature, the bending adjuster 400 maintains a flat state due to the superelasticity of the first plate 410, thereby allowing the electronic device to maintain the flat state. If the temperature of the second plate 420 is a preset temperature or more, the second plate 420 has the superelasticity, and therefore a force exerted by the superelasticity of the second plate 420 is larger than the force exerted by the superelasticity of the first plate 410, such that the shape memorized by the second plate 420 may be maintained.

Meanwhile, in order to make the second plate 420 in the superelastic state, the second plate 420 includes a heating layer 422 formed on one surface thereof. Herein, the heating layer 422 is formed by bonding a heating film operated by electricity or formed by applying a material operated by electricity.

Thereby, the heating layer 422 is supplied with elasticity by a control of a controller (not illustrated) provided on a flexible circuit board 300 to heat the second plate 420 and maintain the temperature of the second plate 420 at the preset temperature or more, such that the electronic device of the present invention may be maintained in the bent state.

In addition, the bent state and the flat unbent state are set through the control of the controller.

Meanwhile, the second plate 420 includes a shielding layer 424 formed on a surface opposite to the surface on which the heating layer 422 is formed. The shielding layer 424 shields the heat and the electromagnetic wave generated from the heating layer 422 so as not to be transferred to an outside, and thereby preventing the flexible circuit board 300 or the display unit 200 from being damaged.

Figure 7:
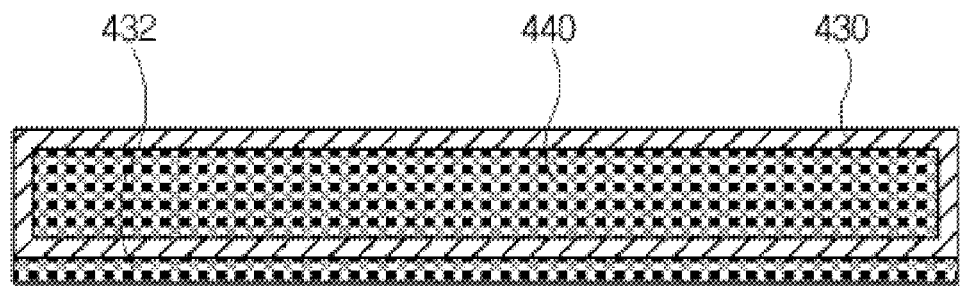
FIG. 7 is a view describing a concept of a bending adjuster installed in a flexible electronic device according to another embodiment of the present invention.

Further, according to another embodiment of the present invention, the flexible electronic device includes a body 100, a display unit 200 included in the body 100, a flexible circuit board 300 included in the body 100, and a bending adjuster 400 included in the body 100, wherein, as illustrated in FIG. 7, a bending adjuster 400a includes a main plate 430 having a flat shape and made of carbon fiber reinforced plastics and an auxiliary plate 440 provided in the main plate 430.

Herein, the auxiliary plate 440 has the superelasticity at a specific temperature or more and is made of a shape memory alloy for maintaining the memorized bent state.

In this case, the main plate 430 is made of the carbon reinforced fibers. Herein, when the carbon reinforced fibers are supplied with elasticity, a carbon component generates heat. As a result, the main plate 430 made of the carbon reinforced fibers is supplied with elasticity to generate heat without forming a separate portion for heat generation so as to heat the auxiliary plate 440 provided therein, such that the auxiliary plate 440 may be maintained at a temperature or more in which it has the superelasticity.

Further, the main plate 430 includes a shielding layer 432 formed on one surface thereof to shield the heat and the electromagnetic wave generated from the auxiliary plate 440, thereby preventing the display unit 200 and the flexible circuit board 300 from being damaged.

Therefore, the main plate 430 has the superelastic characteristics so as to maintain the flat state at room temperature, and when becoming the specific temperature or more, the auxiliary plate 440 is in the superelastic state to maintain the bent state.

Of course, it is configured in such a manner that an elastic force exerted by the auxiliary plate 440 when the auxiliary plate 440 reveals superelasticity is greater than the elastic force exerted by the main plate 430.

Figure 8:
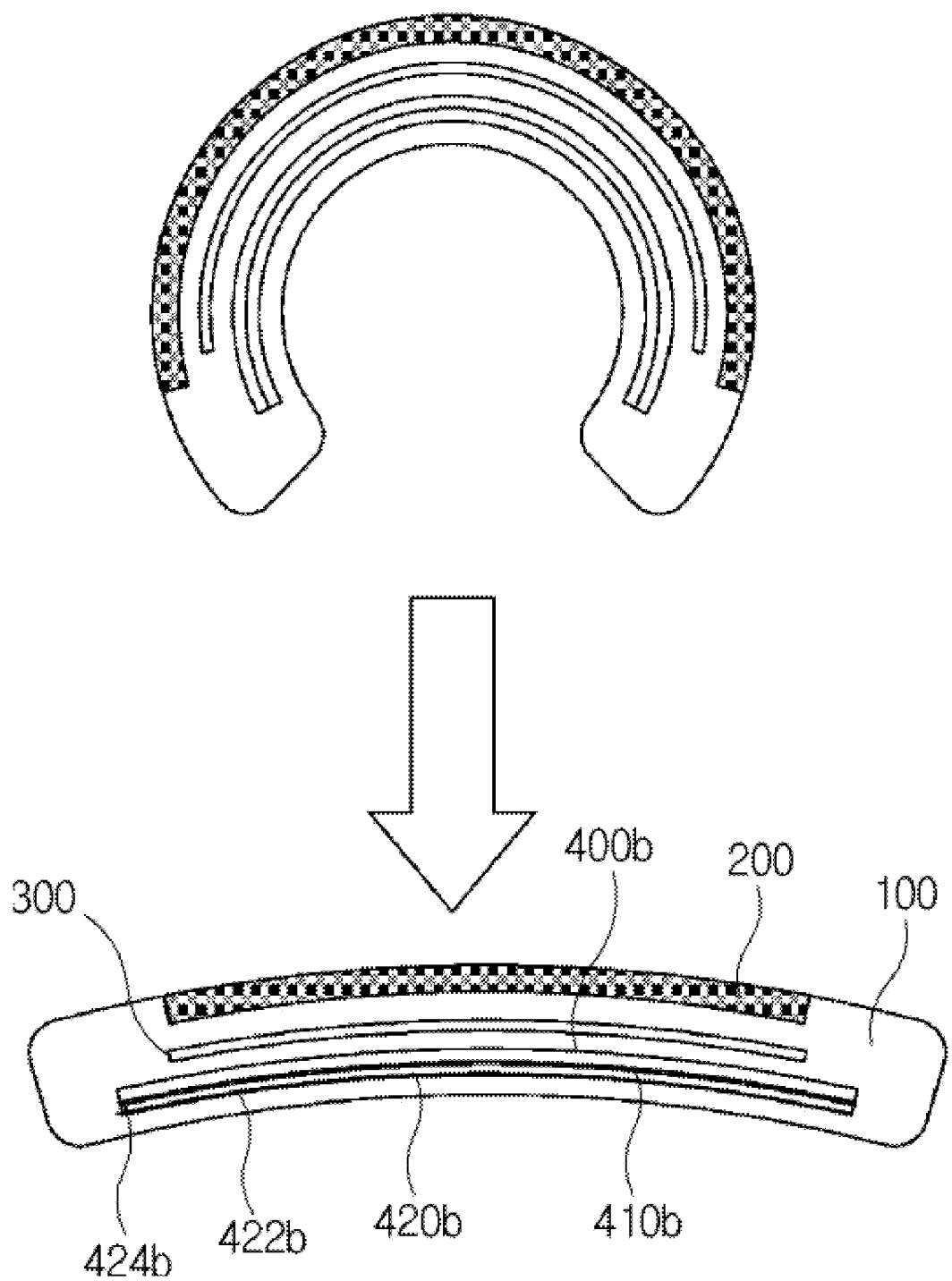
FIG. 8 is views describing a concept of a state in which a flexible electronic device according to another embodiment of the present invention is bent.

Meanwhile, according to another embodiment of the present invention, the flexible electronic device includes a body 100, a display unit 200 included in the body 100, a flexible circuit board 300 included in the body 100, and a bending adjuster 400 included in the body 100, wherein, as illustrated in FIG. 8, a bending adjuster 400b includes a first plate 410b made of a shape memory alloy for maintaining a ring shape at room temperature, high-elastic metal, or a polymer composite material, and a second plate 420b made of a shape memory alloy for maintaining an arc shape having a radius larger than that of the ring shape maintained by the first plate 410b maintains at a specific temperature or more.

Thereby, the electronic device of the present invention is maintained in the ring shape at room temperature to be used as a bracelet, and when the electronic device is operated, the controller heats a heating layer (not illustrated) of the second plate 420b to make the second plate 420b be in the superelastic state, such that the electronic device may be changed into the arc shape.

In this case, of course, it is configured in such a manner that the elastic force exerted by the second plate 420b with being the superelastic state is larger than the elastic force exerted by the first plate 410b.

Figure 9:
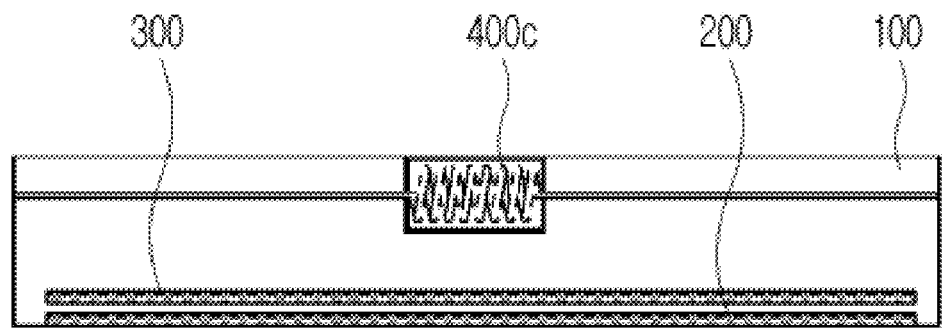
FIG. 9 is a view describing a concept of the flexible electronic device according to another embodiment of the present invention.
Figure 10:
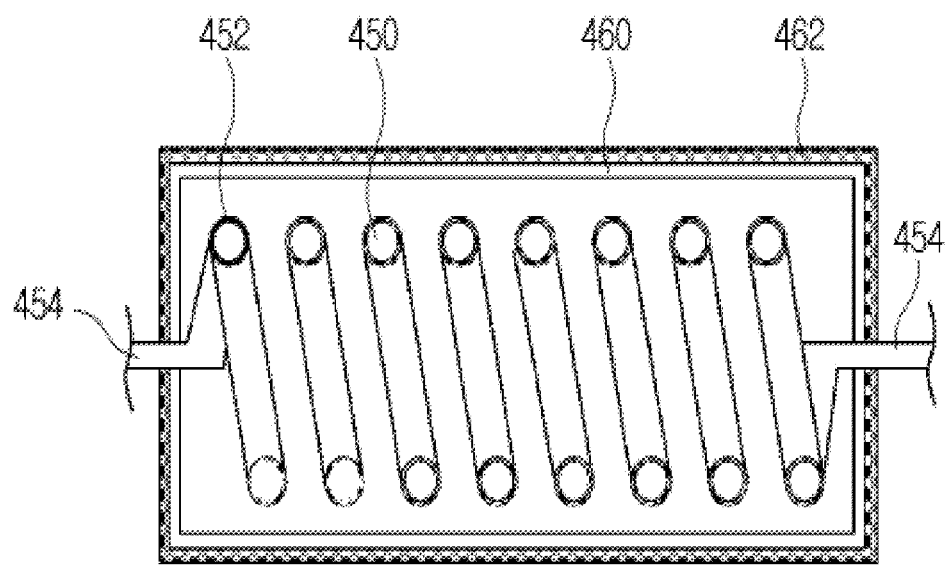
FIG. 10 is an enlarged cross-sectional view of a bending adjuster of FIG. 9.
Figure 11:
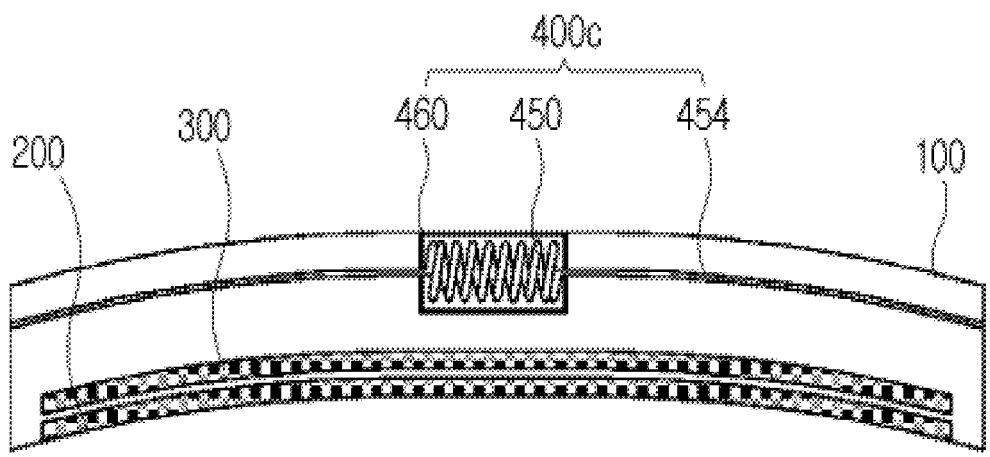
FIG. 11 is a view illustrating a state in which the flexible electronic device of FIG. 9 is bent.

Meanwhile, according to another embodiment of the present invention, as illustrated in FIGS. 9 and 10, the flexible electronic device includes a body 100, a display unit 200 included in the body 100, a flexible circuit board 300 included in the body 100, and a bending adjuster 400c included in the body 100.

Herein, the bending adjuster 400c includes a shape memory spring 450 made of a shape memory alloy capable of returning to a memorized shape under a specific condition, and wires 454 provided at both ends of the shape memory spring 450.

Further, each one end of the wires 454 is connected to both ends of the shape memory spring 450, and each the other end thereof is connected to both side surfaces in the body 100.

Meanwhile, the shape memory spring 450 uses the nitinol containing titanium (Ti) and nickel (Ni) as the major elements, so as to have characteristics of revealing the superelasticity maintaining a flexible state at ordinary times, and then returning to the memorized shape at the specific temperature or more.

Of course, the shape memory alloy of the present invention is not limited to nitinol, but may use an alloy of Cu—Zn—Ni, Cu—Zn—Al, Cu—Al—Ni, Ag—Ni, Au—Cd, or the like, which is obtained by classifying metal contained as the major elements into nickel (Ni), copper (Cu), and iron (Fe), etc., and in detail, combining it with another metal such as zinc (Zn), aluminum (Al), gold (Au), and silver (Ag), etc.

Thereby, the shape memory spring 450 is maintained in a flexible state at room temperature and returns to a spring form that the shape memory alloy memorizes when it is a specific temperature or more (which may be set depending on the used environment, in the present invention, 50° C. is described as an example).

Figure 1:
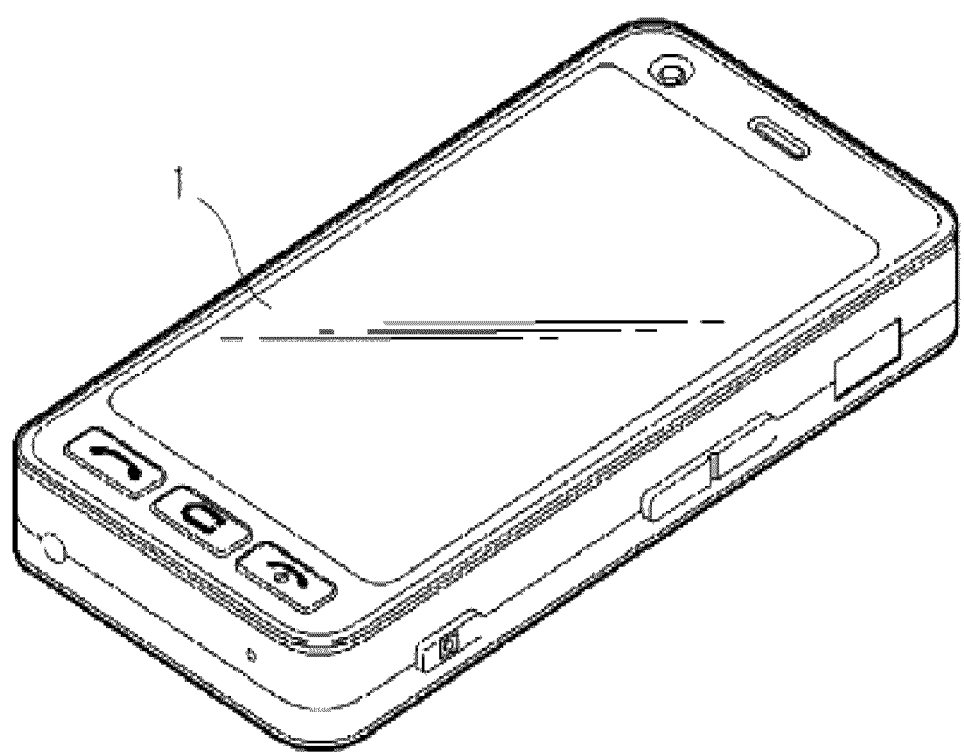
FIG. 1 is a perspective view of a conventional electronic device.
Figure 2:
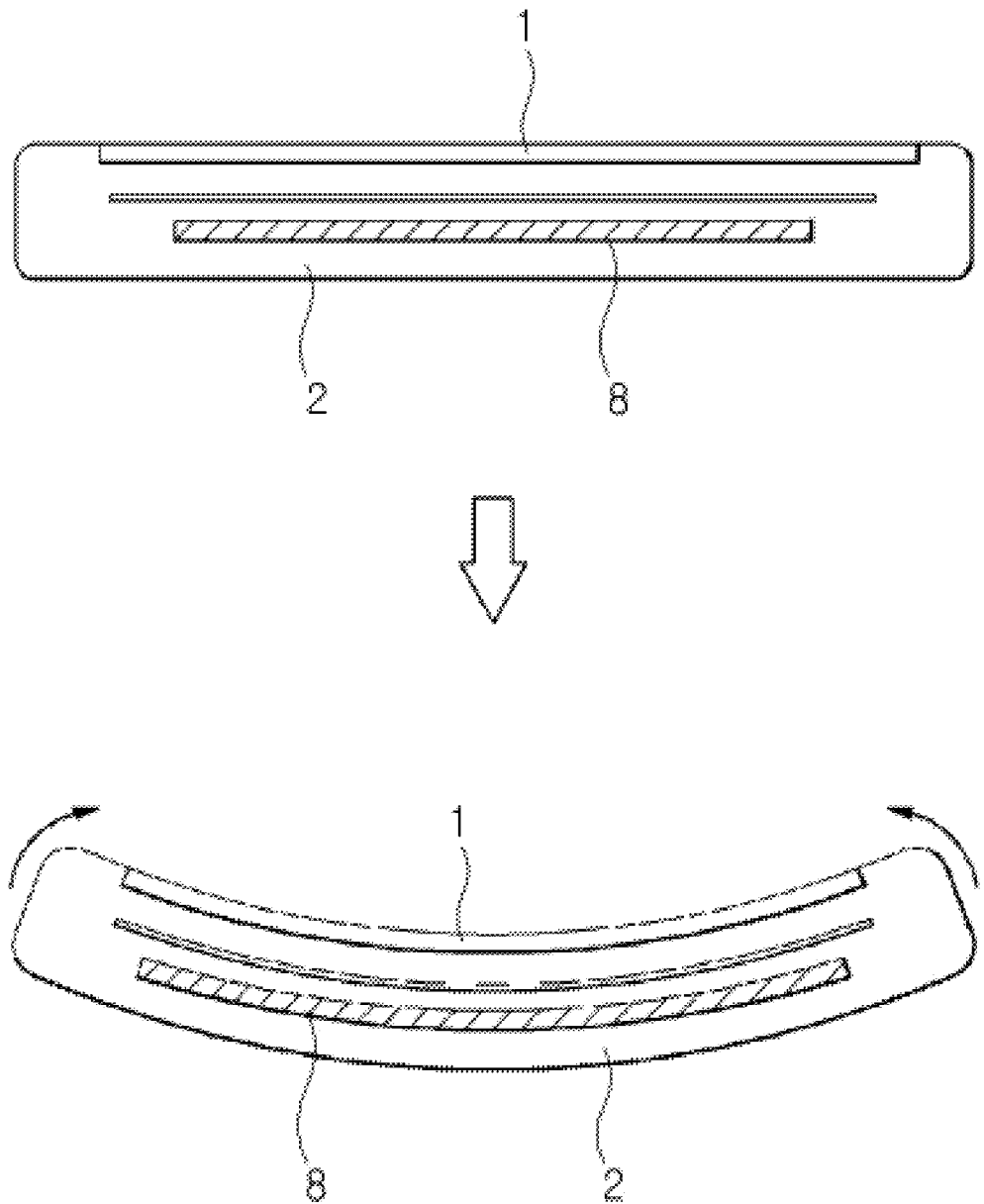
FIG. 2 is views describing a concept of the conventional electronic device.

That is, when installing the bending adjuster 400c including the shape memory spring 450 and the wires 454 in the body 100, if the shape memory spring 450 is prepared in a shape memorized therein, the wires 454 are formed with a short length so as not to contact both side surfaces in the body 100, and when the shape memory spring 450 is maintained in the flexible state at room temperature, both ends of the wires 454 connect to the both side surfaces in the body 100 by deforming the shape memory spring 450. Thereby, since the shape memory spring 450 is maintained in the flexible state at room temperature, the shape memory spring 450 is maintained in a state stretched toward both sides by the elastic force of the body 100 and returns to an original shape due to the superelasticity revealed at the preset temperature of 50° C. or more as illustrated in FIG. 1 to reduce a length of the shape memory spring 450 and pull the wires 454. Accordingly, the electronic device of the present invention may be bent.

Meanwhile, the shape memory spring 450 forming the bending adjuster 400c includes a heating layer 452 formed on the surface thereof. Herein, the heating layer 452 is formed by bonding a heating film operated by electricity or formed by applying a material operated by electricity.

Thereby, the heating layer 452 of the bending adjuster 400c is supplied with elasticity by a control of the controller (not illustrated) provided on the flexible circuit board 300. Then, the shape memory spring 450 is heated by the heating layer 524, and therefore, when the temperature of the shape memory spring is the preset temperature or more, the shape memory spring 450 has the superelasticity to return to the memorized shape.

Further, the shape memory spring 450 may further include an installation box 460 at an outside thereof, in which the shape memory spring 450 is installed. Herein, the installation box 460 is firmly installed in the body 100 to prevent the shape memory spring 450 from arbitrarily moving, such that the electronic device of the present invention may be bent in a desired form.

In this case, the wires 454, which are connected to both sides of the spring 450, are installed by penetrating both side portions of the installation box 460.

Further, the installation box 460 includes a shielding layer 462 formed on the surface thereof. Herein, the shielding layer 462 shields the heat and the electromagnetic wave generated from the heating layer 452 so as not to be transferred to the outside, and thereby preventing the flexible circuit board 300 or the display unit 200 from being damaged.

In this case, the shielding layer 462 may also be formed over the entire surface of the installation box 460, and may also be formed only one surface in a direction in which the flexible circuit board 300 and the display unit 200 are formed.

Figure 12:
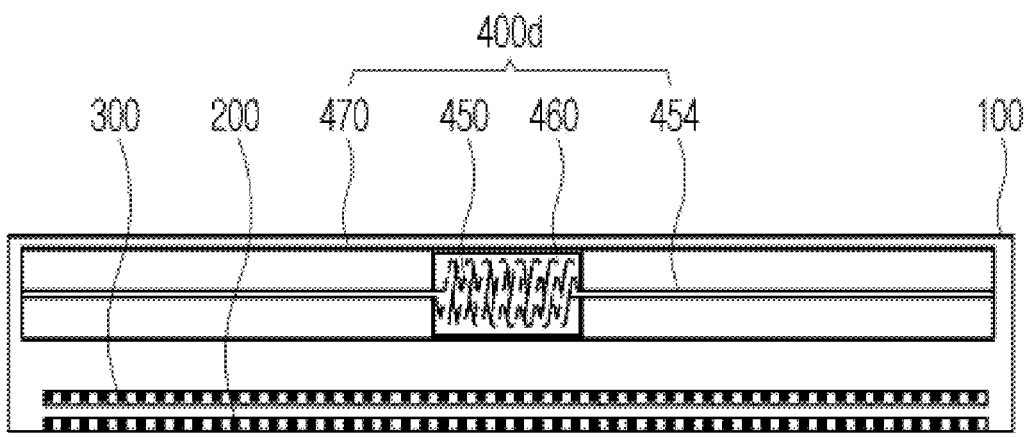
FIG. 12 is a view describing a concept of a flexible electronic device according to another embodiment of the present invention.

Meanwhile, according to another embodiment of the present invention, as illustrated in FIG. 12, a bending adjuster 400d included in the body 100 forming the electronic device of the present invention includes a shape memory spring 450 made of a shape memory alloy capable of returning to the memorized shape under a specific condition, wires 454 provided at both ends of the shape memory spring 450, an installation box 460 in which the shape memory spring 450 is installed, and a cover box 470 in which the installation box 460 is provided at an inner central portion, and both ends of the wires 454 are respectively connected to both side surfaces thereof.

Herein, a back surface of the cover box 470 has a thickness thicker than that of a front surface thereof, so as to reinforce the elastic force. As a result, the shape memory spring 450 is a specific temperature or more to be in the superelastic state, and thus when the wires 454 are pulled, the central portion of the front surface having a weaker elastic force is bent in a concave shape to adjust the bent direction.

Figure 13:
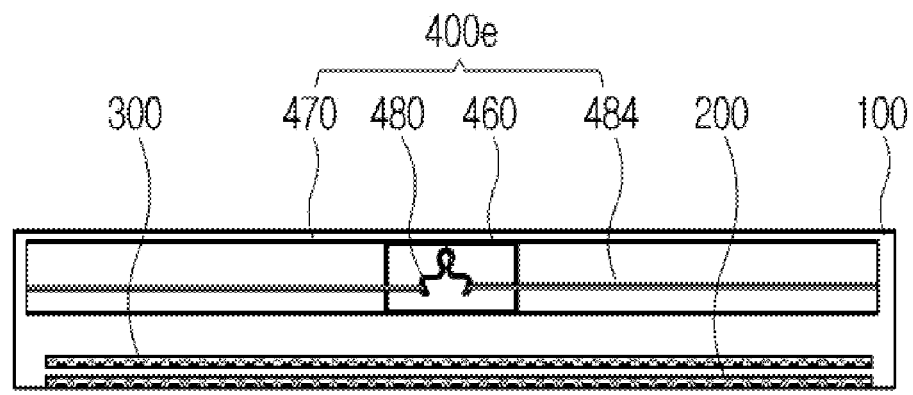
FIG. 13 is a view describing a concept of a flexible electronic device according to another embodiment of the present invention.

Meanwhile, according to another embodiment of the present invention, as illustrated in FIG. 13, the flexible electronic device includes a body 100, a display unit 200 included in the body 100, a flexible circuit board 300 included in the body 100, and a bending adjuster 400e included in the body 100.

Herein, the bending adjuster 400e may include a shape memory loop 480 made of a shape memory alloy capable of returning to the memorized shape under a specific condition, and wires 484 provided at both ends of the shape memory loop 480. Herein, the shape memory loop 480 may have various shapes of loop in addition to the shape illustrated in FIG. 13.

Further, the shape memory loop 480 includes an installation box 460 at the outside thereof, in which the shape memory loop 480 is installed. Herein, the installation box 460 is firmly installed in the body 100 to prevent the shape memory loop 480 from arbitrarily moving, such that the electronic device of the present invention may be bent in a desired form.

In this case, the wires 454, which are connected to both sides of the shape memory loop 480, are installed by penetrating both side portions of the installation box 460.

Meanwhile, the shape memory spring 450 uses the nitinol containing titanium (Ti) and nickel (Ni) as the major elements, so as to have characteristics of revealing the superelasticity maintaining a flexible state at ordinary times, and then returning to the memorized shape at the specific temperature or more.

Of course, the shape memory alloy of the present invention is not limited to nitinol, but may use an alloy of Cu—Zn—Ni, Cu—Zn—Al, Cu—Al—Ni, Ag—Ni, Au—Cd, or the like, which is obtained by classifying metal contained as the major elements into nickel (Ni), copper (Cu), and iron (Fe), etc., and in detail, combining it with another metal such as zinc (Zn), aluminum (Al), gold (Au), and silver (Ag), etc.

Thereby, the shape memory loop 480 is maintained in a flexible state at room temperature to be stretched toward both sides by the wires 484 connected to both sides, such that the electronic device of the present invention may be maintained in a flat state and the shape memory loop 480 returns to a spring form that the shape memory alloy memorizes when it is a specific temperature or more (which may be set depending on the used environment, in the present invention, 50° C. is described as an example) to pull the wires 484.

Meanwhile, the flexible electronic device according to the present invention may be coupled with a separate fixture to maintain the bent state.

The fixture coupled with the electronic device according to the present invention may include an internal elastic cover that normally has a property maintained in a flat state and an external cover that normally has a property maintained in a flat state similarly.

Figure 14:
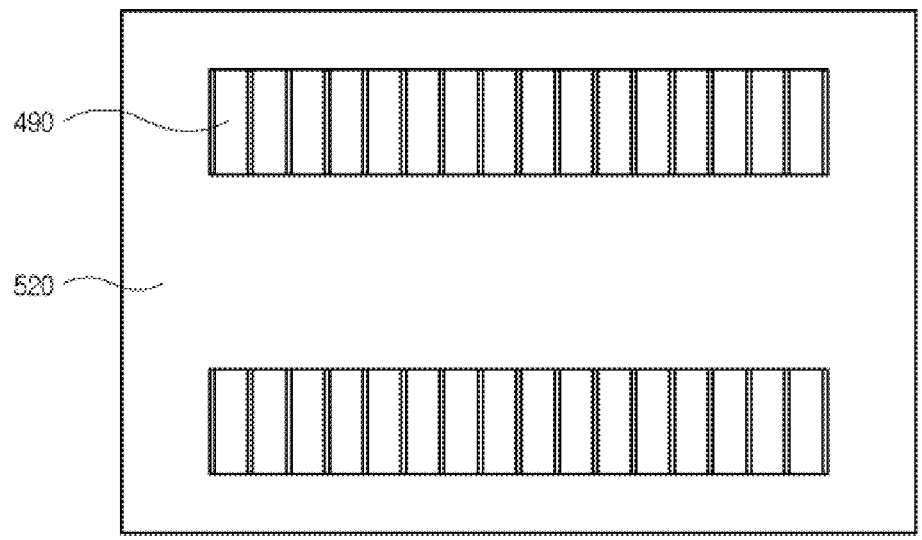
FIG. 14 is a view illustrating an external plastic cover of a fixture coupled with the flexible electronic device according to the present invention.

FIG. 14 is a view illustrating an external cover coupled with the flexible electronic device according to the present invention to maintain the bent state. As illustrated in FIG. 14, an external cover 520 of a fixture 500 coupled with the electronic device according to the present invention has a sawtooth-shaped coupling part 490 formed on one surface thereof to be coupled with an internal cover 510, and is preferably made of a carbon composite material having good elasticity equal to the carbon fiber reinforced plastics.

Figure 15:
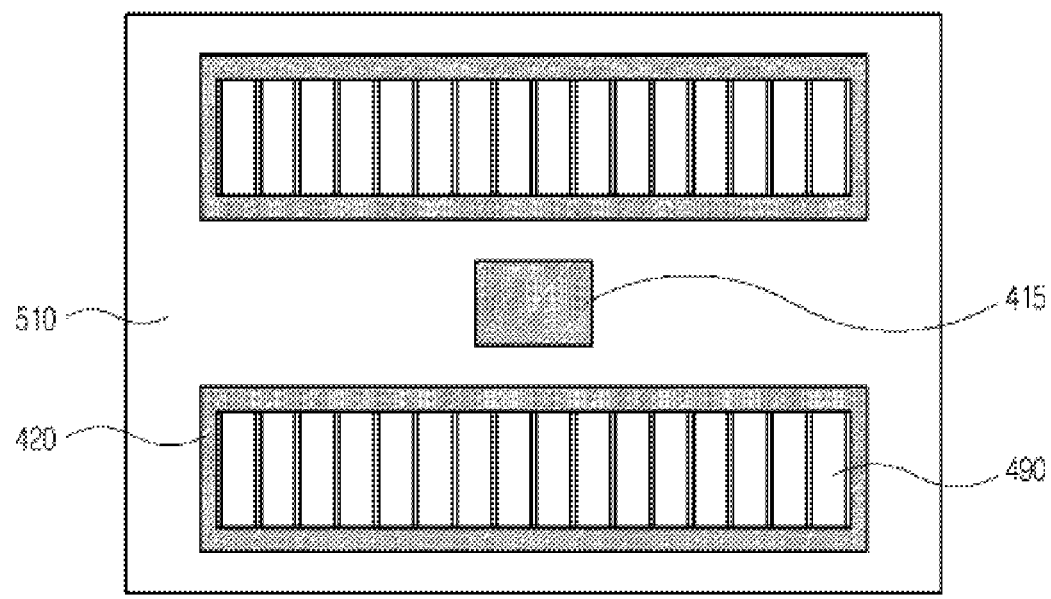
FIG. 15 is a view illustrating an internal plastic cover of the fixture coupled with the flexible electronic device according to the present invention.

FIG. 15 is a view illustrating the internal cover coupled with the flexible electronic device according to the present invention to maintain the bent state. As illustrated in FIG. 15, the internal cover 510 of the fixture 500 coupled with the electronic device according to the present invention has the sawtooth-shaped coupling part 490 formed on one surface thereof to be coupled with an external cover 520, and is provided with a third plate 415 to deform the external cover from the bent state into the flat state. The internal cover 510 according to the present invention is preferably made of the carbon composite material having good elasticity equal to the carbon fiber reinforced plastics In detail, the third plate 415 according to the present invention is temporarily supplied with power in a flat state to be bent in a previously memorized curved shape by the instant superelastic force. In this case, the external cover 520 coupled with the internal cover 510 is pushed by the third plate, and the external cover 520 is deformed from the bent state into the flat state. Therefore, the coupling of the internal cover 510 with the external cover 520 is released, and the internal cover 510 and the electronic device are also simultaneously deformed into the flat state. Similarly, the third plate 415 is in a flexible state while power supplied to the third plate 415 is cut off to be deformed into the flat state between the external cover 520 and the internal cover 510. Thereby, even when power is not supplied to the second plate 420 in the state in which the electronic device according to the present invention is bent, the electronic device is maintained in the bent state by the separate fixture 500 coupled with the electronic device, and thereby minimizing the power consumption of the electronic device.

When the electronic device according to the present invention is implemented as a mobile phone, if voice communication starts, the second plate 420 is supplied with power to be in the superelastic state due to the heating so as to be deformed into the bent state, and is continuously maintained in the bent state by the fixture 500 even if it is not supplied with power in the bent state. Further, when communication ends, the coupling of the fixture 500 is released by the third plate 415 and thus the electronic device is again deformed into the flat state.

Thereby, the electronic device may be maintained in the bent state by the temporary supply of power to minimize power consumption, and may be quickly deformed from the bent state into the flat state.

In this case, the electronic device according to the present invention may receive on/off of bending and time when the bent state is maintained from a user by providing a user interface for maintaining the bent state to the user, and may improve the user convenience by controlling the supply of power to the second plate 420 based on the information input from the user.

Figure 16:
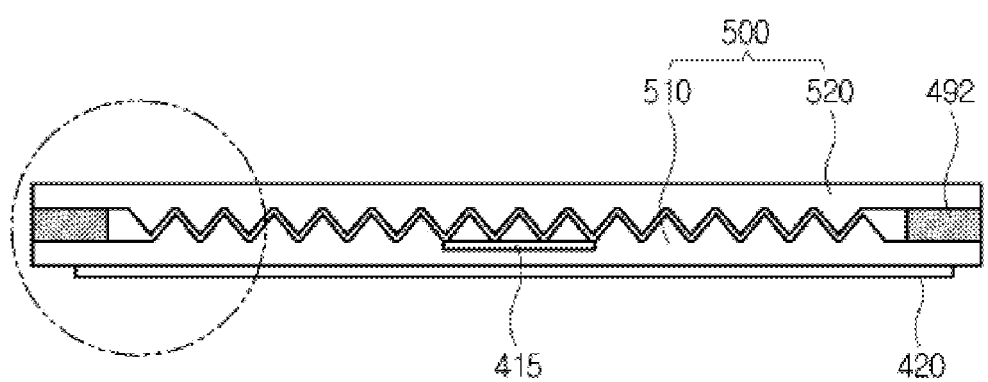
FIG. 16 is a cross-sectional view of the fixture coupled with the flexible electronic device according to the present invention.

FIG. 16 is a cross-sectional view of the fixture illustrating the state in which the external cover 520 and the internal cover 510 according to the present invention are coupled with each other. As illustrated in FIG. 16, the third plate 415 according to the present invention may be provided toward the outside of the internal cover 510, that is, toward the external cover 520.

Figure 17:
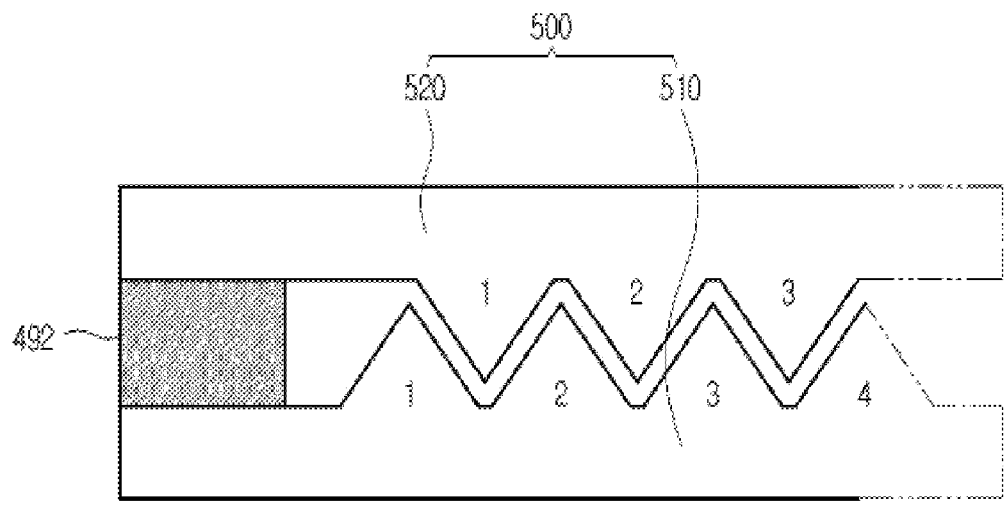
FIG. 17 is an enlarged cross-sectional view of the fixture coupled with the flexible electronic device according to the present invention.
Figure 18:
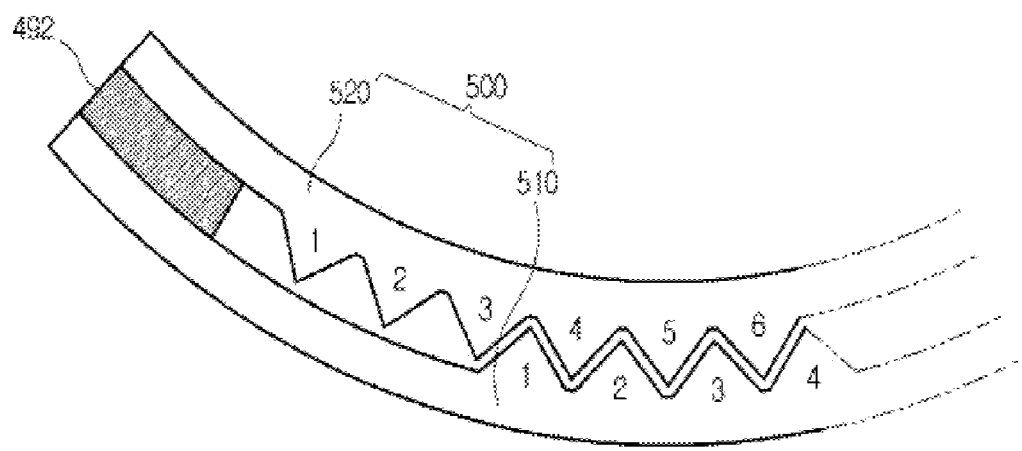
FIG. 18 is a cross-sectional view illustrating a bent state of the fixture coupled with the flexible electronic device according to the present invention.

FIG. 17 is an enlarged cross-sectional view of the fixture illustrating the state in which the external cover 520 and the internal cover 510 according to the present invention are coupled with each other. As illustrated in FIG. 17, when the internal cover 510 and the external cover 520 according to the present invention are bent, as illustrated in FIG. 18, positions of saw-teeth coupled are changed due to a difference in a curvature radius and a separate connection member 492 may be provided between the internal cover 510 and one end of the external cover 520 to maintain the coupling therebetween with being bent.

While the present invention has been described with reference to the preferred embodiments, it will be understood by those skilled in the related art that various modifications and variations may be made therein without departing from the scope of the present invention as defined by the appended claims.

What is claimed is:

1. A flexible electronic device, comprising:
a body made of a flexible material;
a display unit included in the body;
a flexible circuit board included in the body;
a bending adjuster which includes a first plate configured to maintain a flat shape at room temperature, and a second plate being in direct contact with the first plate and configured to maintain a bent state at or higher than a specific temperature in a superelastic state and having an elastic force larger than an elastic force of the first plate in the superelastic state, and is configured to adjust a bending of the body by these plates.

2. The flexible electronic device of claim 1, wherein the first plate includes any one of a shape memory alloy, high-elastic metal, a polymer, and a polymer composite material, and the second plate includes the shape memory alloy.

3. The flexible electronic device of claim 2, wherein the second plate includes a heating layer formed on one surface thereof, and a shielding layer formed on the other surface to shield heat and electromagnetic waves.

4. The flexible electronic device of claim 1, wherein the first plate includes any one of a shape memory alloy maintaining a ring shape at the room temperature, high-elastic metal, a polymer, and a polymer composite material, and
the second plate is configured to maintain an arc shape at or higher than the specific temperature.

5. The flexible electronic device of claim 1, wherein the bending adjuster includes a main plate made of flat or ring-shaped carbon fiber reinforced plastics, and
an auxiliary plate provided in the main plate and made of a shape memory alloy maintaining a state deformed from the flat or ring shape at a specific temperature or more.

6. The flexible electronic device of claim 5, wherein the main plate is configured to generate heat by a supply of elasticity to heat the auxiliary plate, and
the main plate includes a shielding layer formed on one surface thereof to shield heat and electromagnetic waves.

7. The flexible electronic device of claim 1, wherein the bending adjuster includes a shape memory spring or a shape memory loop configuration maintain a flexible state at room temperature and maintain a memorized shape at a specific temperature or more, and
wires of which one end is connected to both ends of the shape memory spring and the other end is connected to both side surfaces in the body, respectively.

8. The flexible electronic device of claim 1, further comprising:
a fixture coupled with the body to fix the body in a bent state when the body is bent.

9. The flexible electronic device of claim 8, wherein the fixture includes an internal cover, and
an external cover coupled with the internal cover.

10. The flexible electronic device of claim 9, further comprising:
a third plate made of a shape memory alloy and formed on one surface of the internal cover or the external cover to release a coupling of the internal cover with the external cover.

11. The flexible electronic device of any one of claims 8, wherein the electronic device receives on/off of bending by the bending adjuster and time when the bent state is maintained from a user by a user interface and controls a supply of power to the second plate based on information input from the user.

12. An electronic device, comprising:
a body made of a flexible material;
a display unit included in the body;
a flexible circuit board included in the body;
a bending adjuster which includes a shape memory spring or a shape memory loop configured to maintain a flexible state at room temperature and maintain a memorized shape at or higher than a specific temperature, and wires of which one end is connected to both ends of the shape memory spring and the other end is connected to both side surfaces in the body, respectively,
wherein the shape memory spring or the shape memory loop includes a heating layer formed on a surface thereof to adjust the bending of the body.

13. The electronic device of claim 12, wherein the shape memory spring or the shape memory loop further includes an installation box at an outside thereof, in which the shape memory spring or the shape memory loop is installed.

14. The electronic device of claim 13, wherein the installation box includes a shielding layer formed on an entire surface or one surface thereof to shield heat and electromagnetic waves.

15. The electronic device of claim 13, wherein the bending adjuster further includes a cover box in which the installation box is installed, and both ends of the wire are connected to both side surfaces of the installation box.

16. The electronic device of claim 15, wherein a front surface and a back surface of the cover box have different thicknesses from each other, and a central portion of a portion having a thin thickness is concavely bent.

17. An electronic device, comprising:
a flexible body; and
a bending adjuster which includes a first plate configured to maintain a flat shape at room temperature, and a second plate being in direct contact with the first plate and configured to maintain a bent state at or higher than a specific temperature in a superelastic state and having an elastic force larger than an elastic force of the first plate in the superelastic state, and is configured to adjust a bending of the body by these plates.

18. The electronic device of claim 17, wherein the first plate includes any one of a shape memory alloy, high-elastic metal, a polymer, and a polymer composite material, and
the second plate includes the shape memory alloy.

19. The electronic device of claim 17, wherein the bending adjuster includes a main plate made of flat or ring-shaped carbon fiber reinforced plastics, and
an auxiliary plate provided in the main plate and made of a shape memory alloy maintaining a state deformed from the flat or ring shape at a specific temperature or more.

* * * * *